United States Patent
Horiuchi et al.

(10) Patent No.: US 6,335,750 B2
(45) Date of Patent: *Jan. 1, 2002

(54) THERMAL PRINT HEAD

(75) Inventors: Hiroshi Horiuchi, Yokohama; Taro Asakura, Tokyo; Hidemi Takeuchi; Masato Ooba, both of Asahikawa, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/500,911

(22) Filed: Feb. 9, 2000

(30) Foreign Application Priority Data

Feb. 12, 1999 (JP) .............................. 11-034455

(51) Int. Cl.⁷ .............................. B41J 2/335; B41J 2/34
(52) U.S. Cl. ........................................ 347/200; 347/209
(58) Field of Search ................................ 347/200, 209, 347/210

(56) References Cited

U.S. PATENT DOCUMENTS 5,450,101 A * 9/1995 Ishida et al. ................ 347/200

* cited by examiner

Primary Examiner—Huan Tran
(74) Attorney, Agent, or Firm—Oblon, Spivak, McClelland, Maier & Neustadt, P.C.

(57) ABSTRACT

The object is to provide a thermal print head that can absorb an expansion due to difference of thermal expansion coefficients of a ceramic substrate and a glass-epoxy based printed circuit board to enable to obtain excellent printing quality, to be high in reliability, and to be capable of downsizing. For this, a thermal print head is constituted to comprise a base provided with heat-generating resistors, a printed circuit board disposed in close proximity to the base, a semiconductor element for driving that is mounted on the base or the printed circuit board and electrically connected to the base and the printed circuit board, and a sealing-member that seals the semiconductor element for driving and includes a hard seal portion consisting of hard sealing-material and a soft seal portion consisting of soft sealing-material more flexible than the hard sealing-material, wherein the hard seal portion is disposed on the base, and the soft seal portion is disposed extended on the base and the printed circuit board.

21 Claims, 6 Drawing Sheets

THERMAL PRINT HEAD

BACKGROUND OF THE INVENTION

1. Field of the Invention

The present invention relates to thermal print heads being used in thermal recording devices such as facsimile machines, video-printers, and engraving printing.

2. Description of the Related Art

Thermal heads, being advantageous in various points such as low noise, low maintenance cost and low running cost, are much used in thermal recording devices of various kinds of office automation devices such as facsimile machines, video-printers or plate making machines.

In general, a thermal head comprises a base, a printed circuit board, and a semiconductor element for driving. The base is provided with heat-generating resistors formed on a heat sink member made of metals of good thermal conduction such as for instance as aluminum. The printed circuit board supplies electricity to the heat-generating resistors. The semiconductor element for driving is formed on either one of the base or the printed circuit board. Here, the base that is provided with the heat-generating resistors and the printed circuit board is electrically connected through the semiconductor element for driving.

On the base, with a main object of improving surface smoothness and heat accumulation property, a graze glass layer is arbitrarily formed. On the graze glass layer, after forming a heat-generating resistor layer and conductor layer such as aluminum, a process of photoengraving is implemented to form a plurality of heat-generating resistors and electrode patterns.

The semiconductor elements for driving are frequently formed on the bases in plate-making machines. On the other hand, in the video-printers, in many cases, the semiconductor elements are formed on the printed circuit boards.

A sealing-member seals to protect an electrical connection between the semiconductor element for driving, and the base provided with the heat-generating resistors and the printed circuit board. The sealing-member consists of resin materials based on such as thermosetting organic resins.

The thermosetting organic resin based materials, if not affecting adversely on the electrical connection, are not particularly restricted. Epoxy-resin based materials, being mechanically strong enough at room temperature after curing, high in adhesion to the base, and deficient of tacky properties on the surface thereof, are suitable. On the other hand, silicone resin based materials that are relatively flexible after curing can be used.

When the silicone based resin materials that are flexible after curing are used as sealing-material, by a metal or resin cover, connection lines and electrical connection and at least part of the base, printed circuit board, semiconductor element for driving, or sealing-member are necessary to be protected from external force. This cover electrically, mechanically and environmentally protects the semiconductor element or the like. This cover is not necessary when sealing-member is such as epoxy-resin or the like that is sufficiently strong when cured.

FIGS. 6 to 9 show cross sections of an existing and general thermal head.

As shown in FIGS. 6 to 9, on a heat sink member 3, a ceramic substrate 1 that is the base and a PCB (Printed circuit board) 2 that is the printed circuit board are adhered through an adhesive layer 4. The heat sink member 3 is made of metal such as aluminum of good thermal conduction. On the ceramic substrate 1, heat-generating resistors 9 and electrode patterns connected to the heat-generating resistors 9 are formed. The PCB 2 supplies an electric current for heating the heat-generating resistors 9, being constituted of for instance epoxy-based material.

The semiconductor element for driving (driving IC) 5 is disposed on either one of the ceramic substrate 1 or the PCB 2. The electrode patterns on the ceramic substrate 1 and the PCB 2 are electrically connected through the driving IC 5 by bonding wires 6 or the like. Further, the driving IC 5 and the electrical connection are sealed and protected by thermosetting organic resin materials 7A or 7B.

In FIGS. 6 and 7, epoxy based resin 7A is used as a sealing-member. In FIG. 6, the driving IC 5 is disposed on the PCB 2 side, and in FIG. 7, the driving IC 5 is formed on the ceramic substrate 1 side that is the base thereon the heat-generating resistors 9 are formed.

In FIGS. 8 and 9, silicone based resin 7B is used as a sealing-member. The silicone based resin 7B being relatively flexible even after curing, the metal cover 8 is fixed by a screw (not shown in the figure) to fix and protect from external force. In FIG. 8, the driving IC 5 is formed on the PCB 2 side, and in FIG. 9, the driving IC 5 is formed on the ceramic substrate 1 side that is the base thereon the heat-generating resistors 9 are formed.

SUMMARY OF THE INVENTION

As mentioned above, in the general thermal print head, the ceramic substrate 1 having heat-generating resistors 9 and the printed circuit board 2 for heating the heat-generating resistors 9 are electrically connected through the driving IC 5 by bonding wires or the like. The thermosetting organic resin material 7A or 7B protects the driving IC 5 and the electrical connection.

The glass epoxy based PCB 2 has a thermal expansion coefficient larger than that of the ceramic substrate 1. Accordingly, when the epoxy resin based material 7A is coated covering both the ceramic substrate 1 and the printed circuit board 2 followed by curing, at the electrical connection after curing, the PCB 2 is connected and fixed in a more expanded state than the ceramic substrate 1.

Upon returning from this state to room temperature, due to difference of contractions of the ceramic substrate 1 and PCB 2, both bends in a plane of the substrate to result in bending of the heat-generating resistors 9 formed on the ceramic substrate 1.

When the heat-generating resistors 9 bend, images are printed bent in their shapes. Further, between end portions and a center portion of a main scanning direction of the heat-generating resistors 9, there occurs a difference in positional relation with a platen roller 10. Accordingly, the images are printed less uniformly in shade. Thus, due to the bending of the heat-generating resistors 9, image quality deteriorates.

In addition, due to the bending of the ceramic substrate 1 and PCB 2 in a plane of the substrate, stress concentrates between the ceramic substrate 1 and PCB 2 and the adhesive layer 4, and the electrical connection. Due to the concentration of the stress, peeling of the ceramic substrate 1 and PCB 2 from the adhesive layer 4, snapping of the bonding wire 6, and peeling or crack of the epoxy resin based material 7A may occur.

On the other hand, when the silicone resin based material 7B is used to seal and protect the electrical connection, the silicone resin based material being relatively flexible after curing, the bending due to the difference of contractions of both substrates is alleviated. Thereby, the bending of the heat-generating resistors 9 is reduced. Accordingly, the deterioration of the image quality and an influence due to the stress concentration can be alleviated.

By contrast, the silicone resin based material 7B is not large in mechanical strength. Accordingly, as mentioned above, to protect the electrical connection from the external impact or the like, it is necessary to provide a cover 8. Provision of the cover 8 causes an influence on the size of the ceramic substrate 1, the position of the heat-generating resistors 9 and the diameter of the platen roller 10. That is, the cover 8 physically hinders from moving the platen roller 10 toward the PCB 2. As a result of this, the ceramic substrate 2 that is expensive can not be downsized and cost reduction becomes difficult.

The present invention is carried out to solve the aforementioned problems and has the following objects.

(1) Expansion due to difference of thermal expansion coefficients of a ceramic substrate and a glass epoxy based printed circuit board is absorbed to provide a thermal print head of excellent printing quality.

(2) To provide a thermal print head of high reliability, further of smaller size.

In order to achieve the aforementioned objects, in the present invention, a thermal print head is constituted in the following manner.

(1) A thermal print head for recording on a recording medium in one mode of the present invention comprises a base provided with heat-generating resistors, a printed circuit board disposed in close proximity to the base, a semiconductor element for driving, and a sealing-member. The semiconductor element for driving is mounted on the base or the printed circuit board and electrically connected to the base and the printed circuit board. The sealing-member seals the semiconductor element for driving and includes a hard seal portion consisting of a hard sealing-material and a soft seal portion consisting of a soft sealing-material more soft than the hard sealing-material. Here, the hard seal portion is disposed on the base, and the soft seal portion is disposed extended on the base and printed circuit board.

The hard seal portion being disposed on the base, this portion does not require a protection due to a cover or the like. The soft seal portion being disposed on the boundary area between the base and the printed circuit board, the bending of the heat-generating resistors can be tempered.

As a result of this, improvement of image quality of the printed images and downsizing of a thermal print head can be accomplished simultaneously.

(2) A thermal print head in one mode of the present invention comprises a base provided with heat-generating resistors, a printed circuit board disposed in close proximity to the base, a semiconductor element for driving, and a sealing-member. The semiconductor element for driving is mounted on the base or the printed circuit board and electrically connected to the base and the printed circuit board. The sealing-member seals the semiconductor element for driving and includes a hard seal portion and soft seal portion. The hard seal portion consists of a hard sealing-material. The soft seal portion consists of a soft sealing-material more soft than the hard sealing-material. Here, the hard seal portion is disposed on the base, the soft seal portion is disposed on the printed circuit board, and the hard seal portion and the soft seal portion are connected.

The soft seal portion being disposed on the printed circuit board, the bending of the heat-generating resistors can be tempered. In addition, the hard seal portion being disposed on the base, this portion does not need protection due to the cover or the like. Still further, the hard seal portion and the soft seal portion being connected, the sealing-member can be improved in strength.

As a result of this, improvement of image quality of the printed images and downsizing of a thermal print head can be accomplished simultaneously.

(3) A thermal print head for recording on a recording medium in another mode of the present invention comprises a base provided with heat-generating resistors, a printed circuit board disposed in close proximity to the base, a semiconductor element for driving, and a sealing-member. The semiconductor element for driving is mounted on the base or the printed circuit board and electrically connected to the base and the printed circuit board. The sealing-member seals the semiconductor element for driving and includes a hard seal portion and soft seal portion. The hard seal portion consists of a hard sealing-material. The soft seal portion consists of a soft sealing-material more soft than the hard sealing-material. Here, the soft seal portion is disposed extended on the base and the printed circuit board, the hard seal portion covering the soft seal portion.

On most surfaces of the base and printed circuit board, the soft sealing-member of high flexibility is disposed. Thereby, the bending of the heat-generating resistors can be tempered. The soft sealing-member being covered by the hard sealing-member, the cover or the like is unnecessary for protection.

As a result of this, improvement of image quality of the printed images and downsizing of a thermal print head can be accomplished simultaneously.

DESCRIPTION OF THE PREFERRED EMBODIMENTS

Thermal heads involving the present invention can be suitably used for various kinds of office automation devices and thermal recording devices such as facsimile machines, video-printers or plate-making machines.

The present invention will be explained based on the following embodiments.

Embodiment 1

Figure 1A:
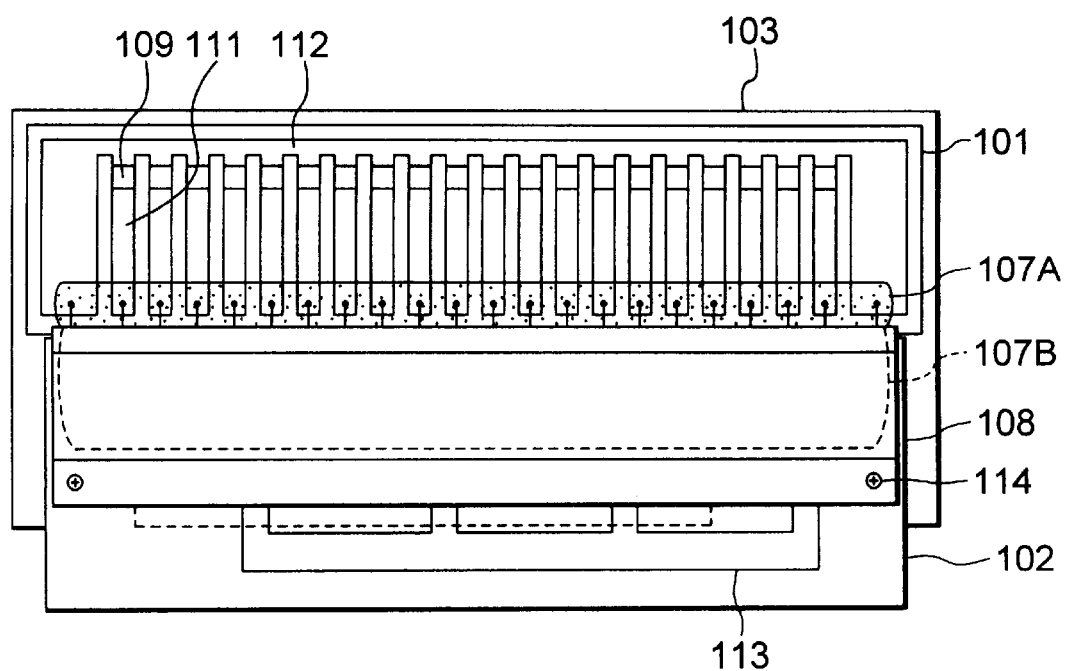
FIG. 1A, FIG. 1B and FIG. 1C are front views of a thermal print head involving the present invention.
Figure 1B:
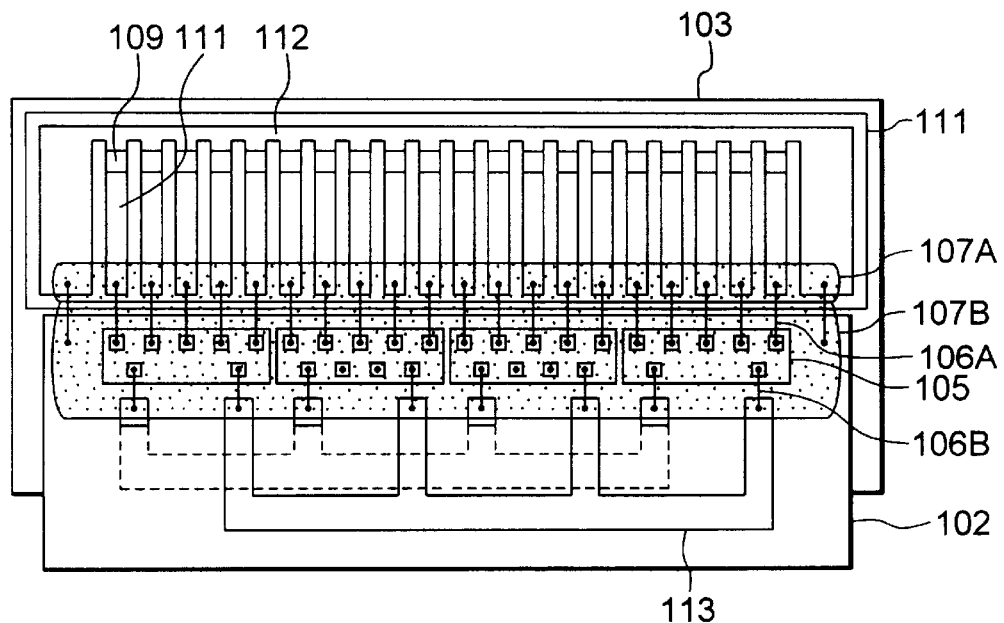
Figure 1C:
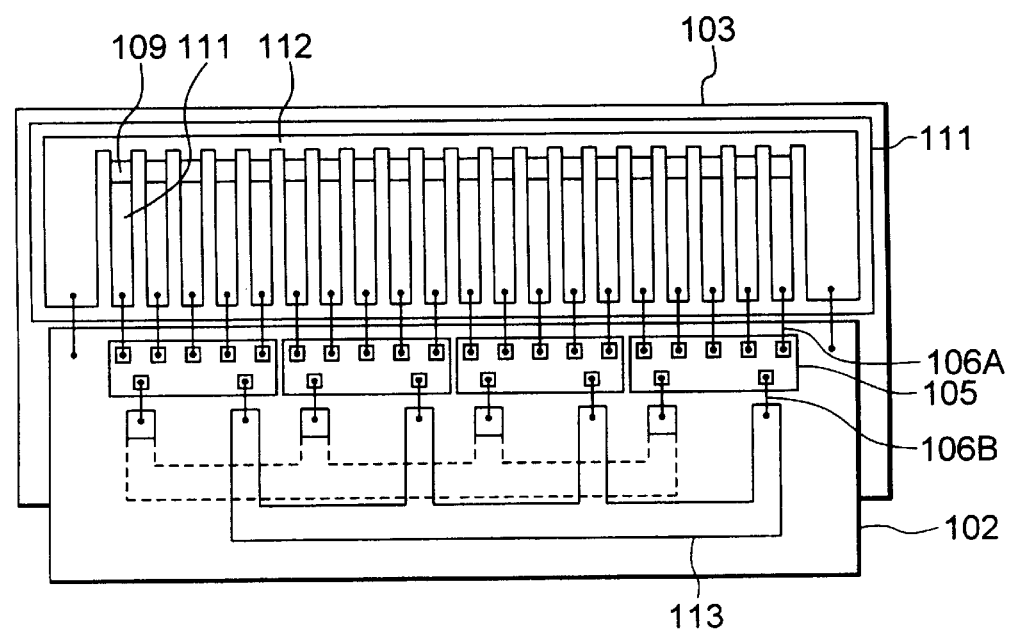
Figure 2:
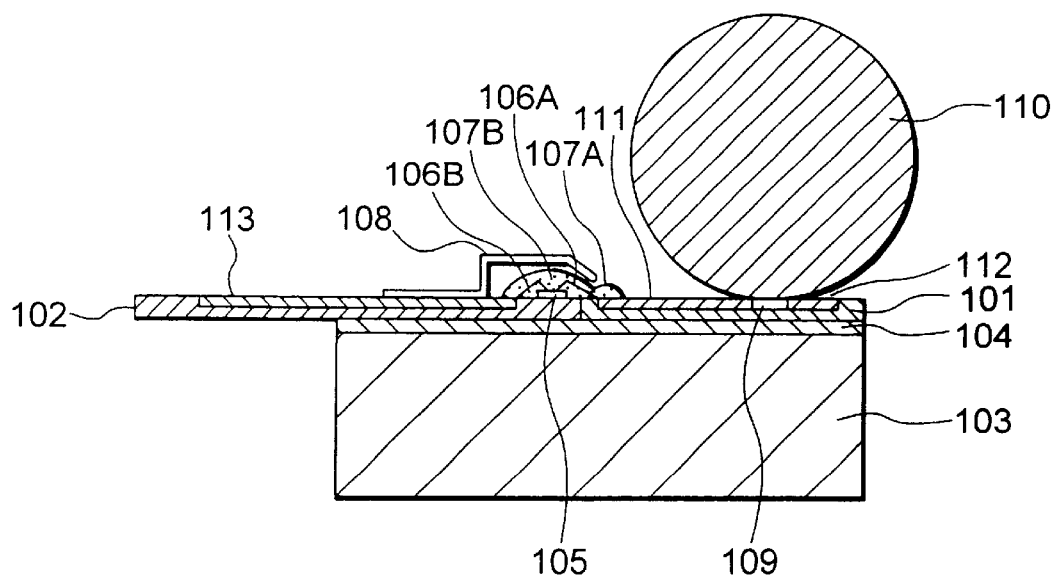
FIG. 2 is a cross section of a thermal print head involving the present invention.

FIGS. 1 and 2 are a front view and a transverse cross sectional view, respectively, showing one embodiment of a constitution of the present invention. Here, in FIG. 1A, a platen roller 110 is omitted to show, in FIG. 1B, further in FIG. 1A, a cover 108, and in FIG. 1C, further in FIG. 1B, a sealing-member 107.

In the following, the present embodiment will be outlined.

As shown in FIGS. 1A, 1B, and 1C and in FIG. 2, a ceramic substrate 101 and a printed circuit board 102 are connected to a heat sink member 3 through an adhesive layer 104.

On the ceramic substrate 101, heat-generating resistors 109, discrete electrodes 111 connected to the respective heat-generating resistors 109, and a common electrode 112 connected to an array of the heat-generating resistors 109 are formed. In the present embodiment, the ceramic substrate 101 constitutes a base.

The printed circuit board 102 is a printed circuit board for driving in which an electric current is supplied to the heat-generating resistors 109 to generate heat, thereon a driving IC (semiconductor element for driving) 105 and a signal line 113 being formed.

Connection lines 106A electrically connect the discrete electrodes 111 on the ceramic substrate 101 and the driving IC 105 on the printed circuit board 102. In addition, on the printed circuit board 2, connection lines 106B electrically connect the driving IC 105 and the signal line 113.

A sealing-member 107 seals the driving IC 105 and connection lines 106A and 106B. A hard sealing-member 107A consisting of a hard sealing-material seals the ceramic substrate 101 side. A soft sealing-member 107B consisting of a soft sealing-material seals the printed circuit board 102 side including a boundary area between the ceramic substrate 101 and the printed circuit board 102.

Further, so as to cover the soft sealing-member 107B, a protection cover 108 is disposed. The protection cover 108 is connected to the printed circuit board 102 by driving a screw 114.

Facing the heat-generating resistors 109, a platen roller 110 is disposed to transport a recording medium.

Thus, in the present invention, on the ceramic substrate 101 side, the hard sealing-member 107A seals the driving IC 105 and an electrical connection thereof, and on the printed circuit board 102 side, the soft sealing-member 107B seals the driving IC 105 and the electrical connection thereof.

The hard sealing-member 107A seals the ceramic substrate 101 side. The hard sealing-member 107A being strong in mechanical strength, the portion is not necessary to be covered to protect due to the cover 108. The soft sealing-member 107B seals the printed circuit board 102 side of which thermal expansion coefficient is larger than that of the ceramic substrate 101. Accordingly, the bending of the heat-generating resistors 109 due to heat treatment during curing of the sealing-member 107 can be tempered. As a result of this, improvement of quality of printed images and downsizing of the thermal print head can be simultaneously realized.

In the following, the details of the above constitution will be explained.

A heat sink member 103 is a heat sink plate constituted of metal such as for instance aluminum of good thermal conduction. As the heat sink plate, any materials, if good in thermal conduction and capable of supporting the ceramic substrate 101 and the PCB 102, are not particularly restricted. However, aluminum or aluminum alloys are preferably used.

For an adhesive layer 4 for adhering the heat sink member 103, and the ceramic substrate 101 and the PCB 2, one having sufficient adhesion to each materials is selected to use.

The ceramic substrate 101 constitutes a base in the present embodiment. Material such as alumina ceramics or the like is ordinarily used but is not restricted to these. On the ceramic substrate 101, to enhance heat accumulation of a thermal print head and to smooth a surface of the substrate to homogeneously form a heat generating element array, a graze layer is preferable to be arbitrarily formed.

As materials for graze layer, $SiO_2$ or $SiO_2$ mixed with Ca, Ba, Al, and Si can be cited. However, in order to prevent resistance value of a thermal print head from rising, a glass transition temperature of the graze glass layer is preferable to be 670° C. or more. A film thickness of the graze glass layer is ordinarily in the range of approximately from 40 to 200 $\mu$m. Here, to form the graze layer, printing method or spraying method can be cited.

As heat generating resistor materials, nitrides of metals of high stability such as nickel (Ni), chromium (Cr) and tantalum (Ta), and various kinds of cermet materials such as $Ta-SiO_2$, $Nb-SiO_2$ and $Ti-SiO_2$ can be appropriately used.

The respective electrodes (discrete electrodes 111, common electrode 112) to be connected to the heat-generating resistors 109 can be Al, Al—Si, and Al—Si—Cu but are not restricted to these.

For the printed circuit board 102, PCB (Printed Circuit Board) in which circuit including the signal line 113 is formed on for instance a glass epoxy substrate, or FPC (Flexible Printed Circuit) can be used. For the printed circuit board 102, other than the PCB and FPC, any one that can mount a connector can be used. The driving IC 105 is mounted on the printed circuit board taking a mode of for instance COB (Chip On Board).

The hard sealing-member 107A and the soft sealing-member 107B are connected to form a sealing-member 107 as a whole, being formed of for instance thermosetting organic resin based material. To be specific, for hard material being used for the hard sealing-member 107A, for instance epoxy-based synthetic resins can be used, and for soft material being used for the soft sealing-member 107B, for instance silicone based synthetic resins can be used.

The epoxy based synthetic resins, at room temperature after curing, have sufficiently high mechanical strength, high adhesion to the substrate, and do not have tacky property on the surface thereof. On the other hand, silicone based synthetic resins are relatively flexible even after curing. The present invention, by combining advantages of both, while reducing the bending of the heat-generating resistors 109, makes a protection to the entire sealing-member 107 due to the cover 108 unnecessary.

Here, when, at an interface between the hard sealing-member 107A and the soft sealing-member 107B, an intermediate layer of large adhesion with both of these is formed, adhesive strength of both layers increases to result in an increase of mechanical strength. For materials of the intermediate layer, when for instance the hard sealing-member 107A and the soft sealing-member 107B are made of epoxy resin based material and silicone based material, respectively, mixture of these can be used.

In the present embodiment, extending on the base 101 and the printed circuit board 102, a soft sealing-member 107 is formed. By contrast, a boundary between the base 101 and the printed circuit board 102 and a boundary between the hard sealing-member 107A and the soft sealing-member 107B may be coincided. At this time, as the sealing-member 107, the hard sealing-member is formed on the base 101, and the soft sealing-member 107B is formed on the printed circuit board 102, both of these being connected.

Materials of the cover 108 are not particularly restricted, and anything that can maintain environmental and mechanical reliability can be used. For instance, metals, among these, stainless steel (SUS) is preferable.

The recording medium is not particularly restricted. Thermosensitive recording paper and plate-making film, printing paper can be illustrated. (Manufacturing Method)

In the following, a manufacturing method of a sealing-member 107 in the present embodiment will be described.

Liquid epoxy based resin and liquid silicone resin materials are coated, respectively, by use of micro-syringe, on a driving IC (semiconductor element) 105, and connection lines 106 and an electrical connection, followed by heating to cure. Thereby, a hard sealing-member 107A and a soft sealing-member 107B are formed, respectively. That is, with single heating step, the hard sealing-member 107A and the soft sealing-member 107B are simultaneously formed. For each material, coating and heating to cure can be implemented.

Due to the use of the soft sealing-member 107A on the printed circuit board 102 side, the heat-generating resistors 109 hardly bend. As a result of this, the heat treatment at higher temperatures than ever can be implemented. When only the epoxy based resin is used for the sealing-member 107 for instance, considering the bending of the heat-generating resistors 109 due to thermal expansion, temperatures for curing are necessary to restrict at for instance 90° C. At this time, it takes for instance 10 hours to cure.

On the contrary, in the present invention, when the epoxy based resin material and silicone resin material are used for instance, temperatures for curing can be raised up to approximately 100 to 150° C. for instance. As the result of this, curing time can be largely decreased to approximately 30 min to 2 hours for instance, resulting in improvement of manufacturing efficiency.

The heat-generating resistors 109, discrete electrodes 111 and a common electrode 112 can be formed by depositing films by use of various kinds of depositing methods such as sputtering method, followed by photoengraving process to pattern.

In order to protect the heat-generating resistors 109 and the respective electrodes 111 and 112, Si—O—N based material is deposited by use of various kinds of deposition method such as sputtering method to form a protection film.

Deposition of the signal line 113 on the printed circuit board 105 can be carried out by use of the ordinary deposition method such as vacuum evaporation method, sputtering method or the like with materials such as Al, Cu or the like.

Embodiment 2

Figure 3:
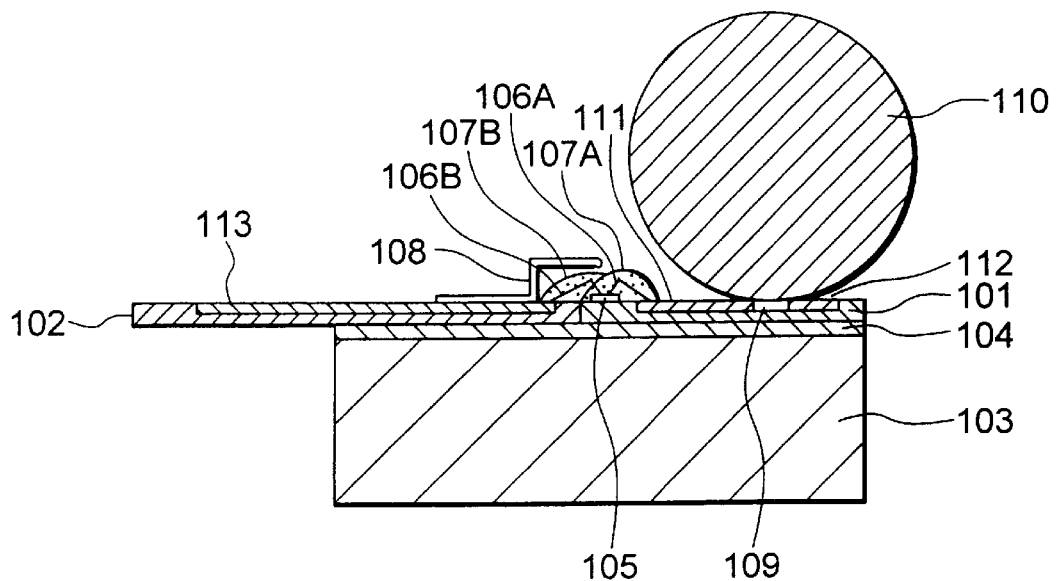
FIG. 3 is a cross section of a thermal print head involving the present invention.

FIG. 3 is a cross section showing one embodiment of a constitution of the present invention, elements having identical function with embodiment 1 being given the identical reference numerals.

A driving IC 105 is formed on a ceramic substrate 101. Except this, embodiment 2 is identical with embodiment 1. Even in the present embodiment, when an intermediate layer is formed at an interface of the hard sealing-member 107A and soft sealing-member 107B, adhesion of both layers increase to result in an increase of mechanical strength.

Any connection method of wire bonding, flip-chip and TAB (Tape Automated Bonding) can connect the common electrode 112 and driving IC 105 of the present invention.

Embodiment 3

Figure 4:
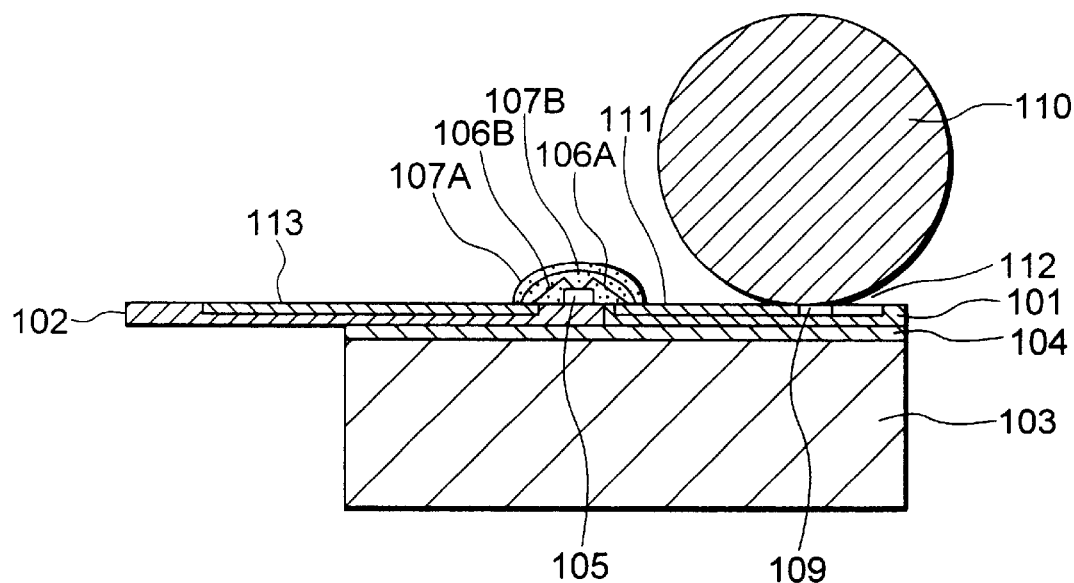
FIG. 4 is a cross section of a thermal print head involving the present invention.

FIG. 4 is a cross section showing one embodiment of a constitution of the present invention. In the following, the present embodiment will be outlined.

As shown in FIG. 4, the ceramic substrate 101 and the printed circuit board 102 are adhered to the heat sink member 103 through the adherent layer 104.

On the ceramic substrate 101, the heat-generating resistors 109, the discrete electrodes 111 connected to the respective heat-generating resistors 109, and the common electrode 112 connected to an array of heat-generating resistors 109 are formed. In the present embodiment, the ceramic substrate constitutes a base.

The printed circuit board 102 is a driving printed circuit board for supplying electricity to the heat-generating resistors 109 to generate heat, thereon the driving IC 105 and the signal line 113 being formed.

Connection lines 106A electrically connect the discrete electrodes 111 on the ceramic substrate 101 and the driving IC 105 on the printed circuit board 102. On the printed circuit board 102, connection lines 106B connect the driving IC 105 and the signal line 113.

The sealing-member 107 seals the driving IC 105 and the connection lines 106A and 106B. Here, after sealing with the soft sealing-member 107B, thereon the hard sealing-member 107A is coated to constitute in a duplicate sealing structure.

Thus, the present invention, by further covering the lower layer of the soft sealing-member 107B with the hard sealing-member 107A, seals the electrical connection.

The hard sealing-member 107A of large mechanical strength covers the soft sealing-member 107B, resulting in disuse of protection due to the cover 108. Flexible soft sealing-member 107B is disposed on most part of the ceramic substrate 101 and the printed circuit board 102. Thereby, the bending of the heat-generating resistors 109 due to heating during curing the sealing-member 107 can be tempered. As the result of this, improvement of image quality of printed images and downsizing of a thermal print head can be simultaneously realized.

Here, on the printed circuit board 102 of large thermal expansion coefficient, part of the hard sealing-member 107A that is less flexible contacts. However, if a thickness on the printed circuit board 102 is sufficiently small compared with that of the soft sealing-member 107B, the heat-generating resistors 109 do not bend.

For the hard sealing-member 107A and soft sealing-member 107B, for instance epoxy resin based material and silicone resin based material can be used, respectively. The sealing-member 107, by sequentially dripping liquid silicone resin based material and epoxy resin based material by use of a micro-syringe or the like, followed by heating for curing, can be formed.

In addition, when at an interface between an upper layer and a lower layer an intermediate layer is formed, adhesion between the upper layer and the lower layer increases, and the mechanical strength of the sealing-member 107 also can be improved. As the intermediate layer, the epoxy resin based material and the silicone resin based material can be mixed to use.

Embodiment 4

Figure 5:
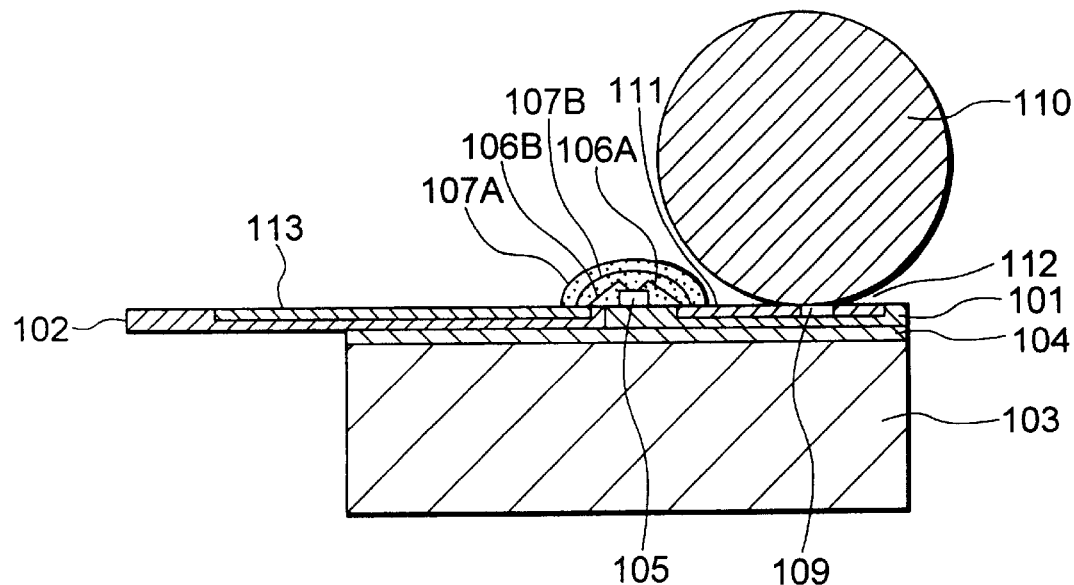
FIG. 5 is a cross section of a thermal print head involving the present invention.
Figure 6:
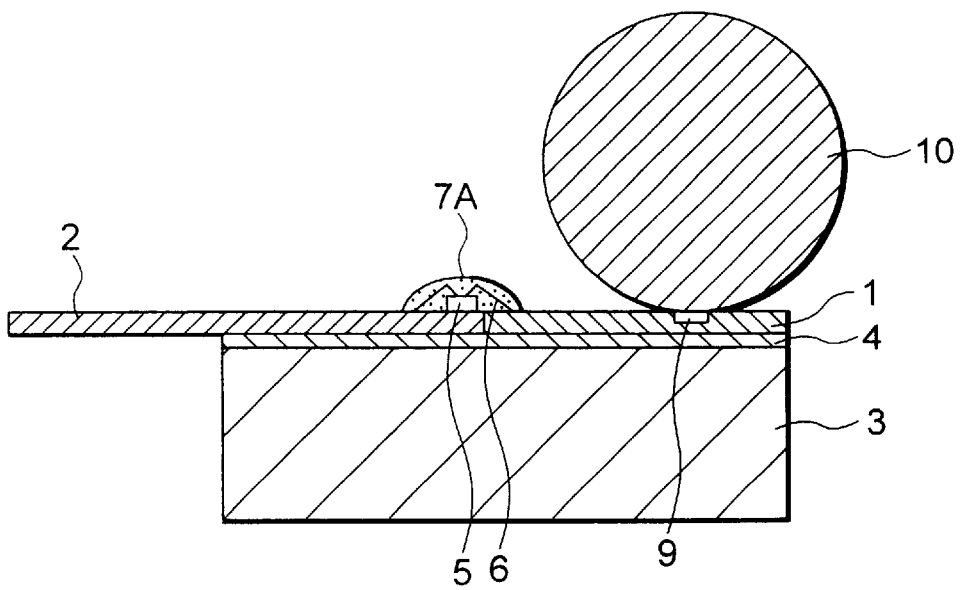
FIG. 6 is a cross section of an existing thermal print head.
Figure 7:
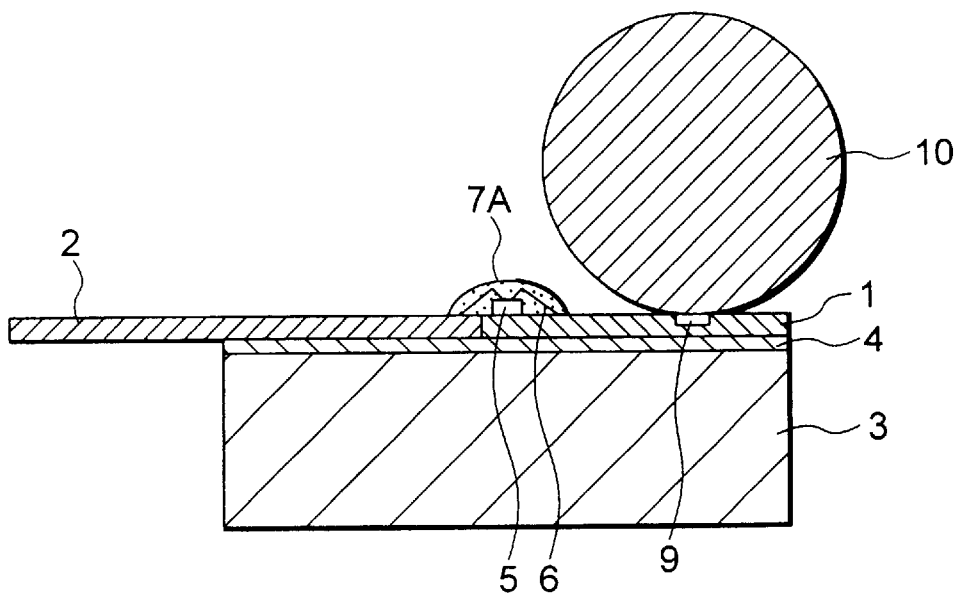
FIG. 7 is a cross section of an existing thermal print head.
Figure 8:
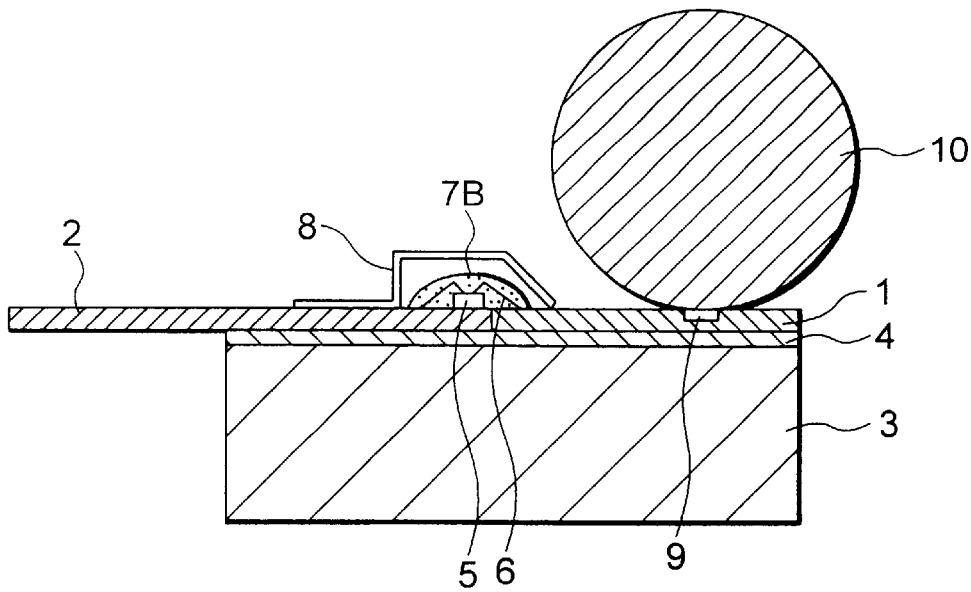
FIG. 8 is a cross section of an existing thermal print head.
Figure 9:
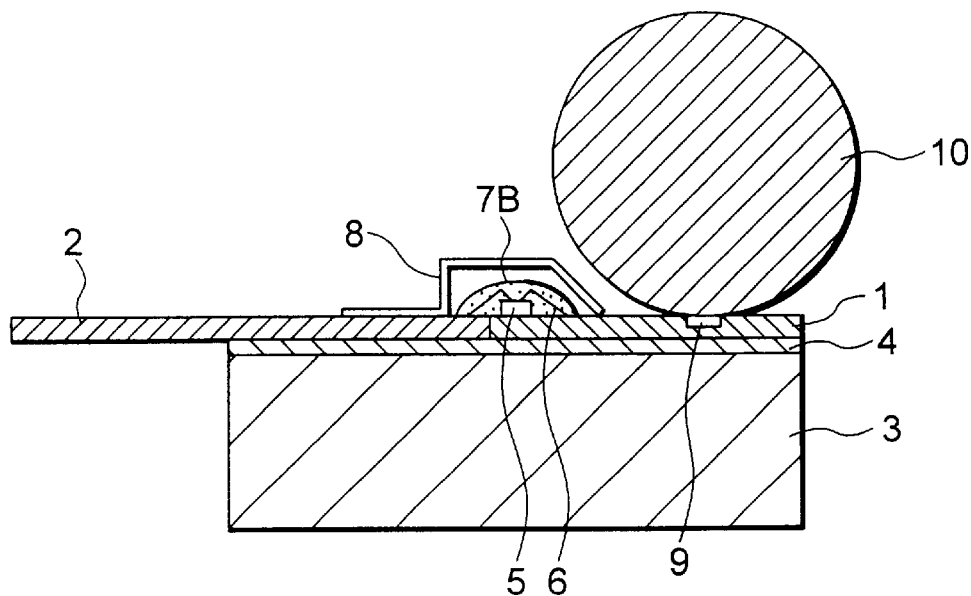
FIG. 9 is a cross section of an existing thermal print head.

FIG. 5 shows one embodiment of a constitution of the present invention, the elements of the identical function with embodiment 3 being given the same reference numerals.

On the ceramic substrate 101, the driving IC 105 is formed. Except for this, embodiment 4 is identical with embodiment 3. Even in the present embodiment, at the interface between the upper layer and the lower layer an intermediate layer of strong adhesion with both layers is formed. Thereby, adhesion between the upper layer and the lower layer increases and the mechanical strength of the sealing-member 107 can be improved.

Other Embodiments

Embodiment of the present invention is not restricted to the above embodiments, and can be expanded and modified in the range of technical idea of the present invention. These expanded and modified embodiments also can be included in the present technical range.

(1) The present invention is not restricted by modes of electrical connection between a driving IC 105 and, a base 101 and a printed circuit board 102. Other than wire bonding, any one of flip-chip bonding, TAB (Tape Automated Bonding) or the like may be used to implement the electrical connection.

(2) In the present invention, it is not necessarily required to seal an entire of the driving IC 105. For instance, when plastics or the like is used to package the driving IC 105, the package works as a protection against the air and external impact. Accordingly, there is no need for further sealing.

An object of sealing the driving IC 105 is to shut an electrical connection of the driving IC 105 from the air to prevent state of electrical connection from deteriorating. Accordingly, the electrical connection of the driving IC 105 needs only be shut from the air. For instance, in implementing the electrical connection with a bump, the bump is disposed at a narrow gap between the driving IC 105 and the printed circuit board 102 and so on. Accordingly, if sealing the surroundings of the boundary of the driving IC 105 and the printed circuit board 102, the object of sealing can be achieved.

It is not necessarily required for the sealing-member 107 to directly contact the electrical connection of the driving IC 105.

(3) Fundamental thinking of the present invention is as follows. A flexible soft sealing-member 107B mainly and directly seals the printed circuit board 102 of larger thermal expansion coefficient and, and a hard sealing-member 107A of larger mechanical strength seals other part thereof. Thereby, heat-generating resistors 109 are bent less and downsized simultaneously.

Accordingly, the mode of sealing is not restricted to the aforementioned two constitutions. That is, in one constitution, the hard sealing-member 107A seals the base 101 side and the soft sealing-member 107B seals the printed circuit board 102 side. In the other constitution, after sealing with the soft sealing-member 107B, the hard sealing-member 107A covers the member 107B. However, in the present invention, the above two constitutions may be combined to use.

For instance, the hard sealing-member 107A seals the base 101 side and the soft sealing-member 107B seals the printed circuit board 102 side, in addition part of the hard sealing-member 107A may cover the soft sealing-member 107B.

Further, in a constitution in which the hard sealing-member 107A seals the base 101 side and the soft sealing-member 107B seals the printed circuit board 102 side, the hard sealing-member 107A may seal part of the printed circuit board 102. A thickness of the hard sealing-member 107A on the printed circuit board 102, when sufficiently small compared with that of the soft sealing-member 107B, can be acceptable from a viewpoint of reduction of bending of the heat-generating resistors 109.

In short, the soft sealing-member 107B need only alleviate the stress due to the thermal expansion of the printed circuit board 102.

(4) The degree of hardness of the hard sealing-member 107A and the soft sealing-member 107B is not necessarily absolute but relative. Accordingly, materials for sealing are not restricted to epoxy based resins and silicone based resins. With the soft sealing-member 107B more flexible than the hard sealing-member 107A and the hard sealing-member 107A stronger in mechanical strength than the soft sealing-member 107B, the present invention need only be constituted.

Here, the degree of softness of the soft sealing-member 107B can be evaluated by Young's modulus. Materials of smaller Young's modulus, when being elongated, cause less stress. Accordingly, the soft sealing-member 107B of relatively small Young's modulus, when the printed circuit board 102 that is expanded due to heating is cooled to contract, contracts therewith. As a result of this, the soft sealing-member 107B alleviates thermal stress caused at the boundary of the base 101 and the printed circuit board 102.

On the contrary, the mechanical strength of the hard sealing-member 107A can be evaluated with JIS hardness (hardness due to Japanese Industrial Standard K6900, No.411) that is one evaluation criterion of for instance plastic materials. The hard sealing-member 107A of large hardness, being less deformed by the external mechanical impact, is hardly broken at the seal when exposed to the impact.

(5) Further, the present invention is not restricted in circuit constitution on the ceramic substrate 101 and printed circuit board 102. For instance, the present invention does not depend on shapes of the discrete electrodes 111, common electrode 112 and signal line 113.

What is claimed is:

1. A thermal print head for recording on a recording medium, comprising:

a base;

heat-generating resistors disposed on said base;

a printed circuit board disposed in close proximity to the base;

a semiconductor element configured to drive the heat-generating resistors, mounted on at least one of the base and the printed circuit board, and electrically connected to the base and the printed circuit board; and a sealing-member configured to seal the semiconductor element, including, a hard seal portion including a hard seal material, and a soft seal portion including a soft seal material more flexible than the hard seal material, wherein the hard seal portion is disposed on the base, the soft seal portion is disposed extended on the base and the printed circuit board, and thermal expansion coefficients of the base and the printed circuit board are different from each other.

2. The thermal print head as set forth in claim 1, further comprising:

a cover by which the thermal print head covers the soft seal portion.

3. The thermal print head as set forth in claim 1, wherein the hard seal portion and the soft seal portion are connected.

4. The thermal print head as set forth in claim 1, wherein the hard seal portion and the soft seal portion are connected through an intermediate layer.

5. The thermal print head as set forth in claim 1, wherein the hard sealing-material is epoxy based resin, and the soft sealing-material is silicone based resin.

6. The thermal print head as set forth in claim 1, wherein the semiconductor element configured to drive the heat-generating resistors is mounted on the printed circuit board.

7. The thermal print head as set forth in claim 1, wherein the semiconductor element configured to drive the heat-generating resistors is mounted on the base.

8. A thermal print head for recording on a recording medium, comprising:

a base;

heat-generating resistors disposed on said base;

a printed circuit board disposed in close proximity to the base;

a semiconductor element configured to drive the heat-generating resistors, mounted on at least one of the base and the printed circuit board, and electrically connected to the base and the printed circuit board; and a sealing-member configured to seal the semiconductor element, including,
a hard seal portion including a hard seal material, and
a soft seal portion including a soft seal material more flexible than the hard seal material,
wherein the hard seal portion is disposed on the base, the soft seal portion is disposed on the printed circuit board, the hard seal portion and the soft seal portion are connected, and thermal expansion coefficients of the base and the printed circuit board are different from each other.

9. The thermal print head as set forth in claim 8, further comprising:

a cover by which the thermal print head covers the soft seal portion.

10. The thermal print head as set forth in claim 8, wherein the hard seal portion and the soft seal portion are connected.

11. The thermal print head as set forth in claim 8, wherein the hard seal portion and the soft seal portion are connected through an intermediate layer.

12. The thermal print head as set forth in claim 8, wherein the hard sealing-material is epoxy based resin, and the soft sealing-material is silicone based resin.

13. The thermal print head as set forth in claim 8, wherein the semiconductor element configured to drive the heat-generating resistors is mounted on the printed circuit board.

14. The thermal print head as set forth in claim 8, wherein the semiconductor element configured to drive the heat-generating resistors is mounted on the base.

15. A thermal print head for recording on a recording medium, comprising:

a base;

heat-generating resistors disposed on said base;

a printed circuit board disposed in close proximity to the base;

a semiconductor element configured to drive the heat-generating resistors, mounted on at least one of the base and the printed circuit board, and electrically connected to the base and the printed circuit board; and a sealing-member configured to seal the semiconductor element, including,
a hard seal portion including a hard seal material, and
a soft seal portion including a soft seal material more flexible than the seal material,
wherein the soft seal portion is disposed extended on the base and the printed circuit board, the hard seal portion covers the soft seal portion, and thermal expansion coefficients of the base and the printed circuit board are different from each other.

16. The thermal print head as set forth in claim 15, wherein an intermediate layer intervenes at a boundary between the hard seal portion and the soft seal portion.

17. The thermal print head as set forth in claim 15, wherein the hard sealing-material is epoxy based resin, and the soft sealing-material is silicone based material.

18. The thermal print head as set forth in claim 15, wherein the semiconductor element configured to drive the heat-generating resistors is mounted on the printed circuit board.

19. The thermal print head as set forth in claim 15, wherein the semiconductor element configured to drive the heat-generating resistors is mounted on the base.

20. The thermal print head as set forth in claim 15, wherein a thickness of the soft seal portion is larger than that of the soft seal portion.

21. The thermal print head as set forth in claim 15, wherein the hard seal portion is disposed to a degree in which the hard seal portion does not touch the recording medium and a unit for transporting the recording medium.

* * * * *